US008921759B2

(12) United States Patent
Oganesian

(10) Patent No.: US 8,921,759 B2
(45) Date of Patent: Dec. 30, 2014

(54) INTEGRATED IMAGE SENSOR PACKAGE WITH LIQUID CRYSTAL LENS

(75) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 325 days.

(21) Appl. No.: 13/559,510

(22) Filed: Jul. 26, 2012

(65) Prior Publication Data

US 2014/0027612 A1 Jan. 30, 2014

(51) Int. Cl.
*H01J 3/14* (2006.01)
*H01J 40/14* (2006.01)
*H01L 27/146* (2006.01)

(52) U.S. Cl.
CPC .... *H01L 27/14625* (2013.01); *H01L 27/14618* (2013.01); *H01L 27/14636* (2013.01)
USPC .......................................... 250/216; 250/239

(58) Field of Classification Search
CPC ................... H01L 27/14625; H01L 27/14618; H01L 27/14636; H01L 27/146
USPC ............... 250/208.1, 214.1, 214 R, 216, 239; 349/33, 37, 95, 147, 149, 151, 152, 349/155, 156, 157, 158; 345/40, 42, 90, 95, 345/102, 103; 257/431, 432, 433
See application file for complete search history.

(56) References Cited

U.S. PATENT DOCUMENTS

| | | | |
|---|---|---|---|
| 6,166,784 A | 12/2000 | Murata et al. | |
| 6,777,767 B2 | 8/2004 | Badehi | |
| 6,972,480 B2 | 12/2005 | Zilber et al. | |
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,495,341 B2 | 2/2009 | Zilber et al. | |
| 7,642,629 B2 | 1/2010 | Zilber et al. | |
| 7,683,975 B2 | 3/2010 | Kageyama | |
| 7,859,033 B2 | 12/2010 | Brady | |
| 7,986,178 B2 | 7/2011 | Lynch | |
| 8,643,762 B2 * | 2/2014 | Suzuki et al. | ........... 348/335 |
| 2004/0251525 A1 | 12/2004 | Zilber | |
| 2005/0104179 A1 | 5/2005 | Zilber | |

(Continued)

OTHER PUBLICATIONS

U.S. Appl. No. 13/157,193, filed Jun. 9, 2011, Oganesian, Vage.

(Continued)

*Primary Examiner* — Georgia Y Epps
*Assistant Examiner* — Don Williams
(74) *Attorney, Agent, or Firm* — DLA Piper LLP (US)

(57) ABSTRACT

A package structure with a sensor chip having a first substrate with front and back opposing surfaces, a plurality of photo detectors and contact pads formed at the front surface and electrically coupled together, a plurality of first electrical contacts each extending from the back surface and through the first substrate to one of the contact pads, and a plurality of second electrical contacts each extending from the back surface and through the first substrate to the front surface. The liquid crystal lens includes a layer of liquid crystal material, one or more lead patterns adjacent the layer of liquid crystal material, and a plurality of third electrical contacts each extending from one of the one or more lead patterns. The sensor chip is mounted to the liquid crystal lens such that each of the third electrical contacts is electrically connected to one of the plurality of second electrical contacts.

42 Claims, 22 Drawing Sheets

(56) References Cited

U.S. PATENT DOCUMENTS

| | | |
|---|---|---|
| 2005/0205977 A1 | 9/2005 | Zilber |
| 2005/0225877 A1 | 10/2005 | Tang |
| 2007/0138498 A1 | 6/2007 | Zilber |
| 2007/0190691 A1 | 8/2007 | Humpston |
| 2007/0190747 A1 | 8/2007 | Humpston |
| 2007/0268417 A1 | 11/2007 | Kato et al. |
| 2007/0279365 A1 | 12/2007 | Kageyama |
| 2007/0279539 A1 | 12/2007 | Suzuki et al. |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0088756 A1 | 4/2008 | Tseng et al. |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0225404 A1 | 9/2008 | Tang |
| 2008/0239136 A1 | 10/2008 | Kanai et al. |
| 2008/0246136 A1 | 10/2008 | Haba |
| 2009/0021823 A1 | 1/2009 | Heim et al. |
| 2009/0115047 A1 | 5/2009 | Haba |
| 2009/0128922 A1 | 5/2009 | Justis et al. |
| 2009/0160065 A1 | 6/2009 | Haba |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian et al. |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.

* cited by examiner

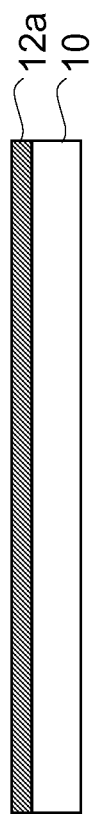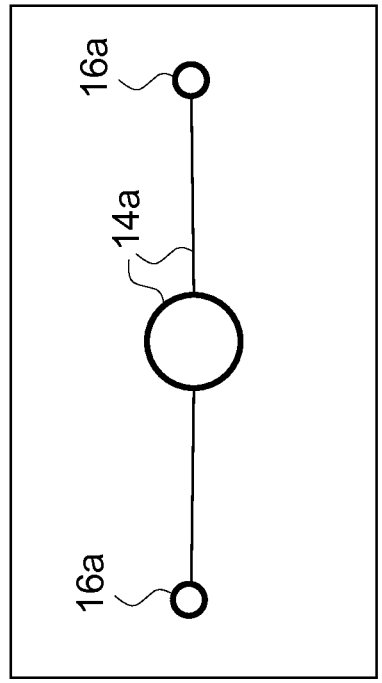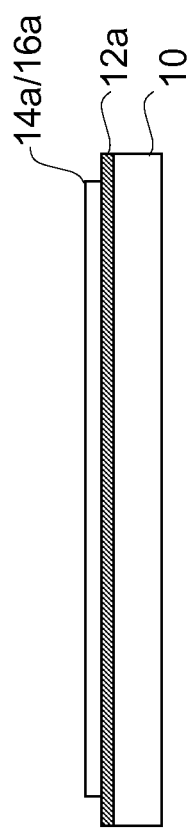

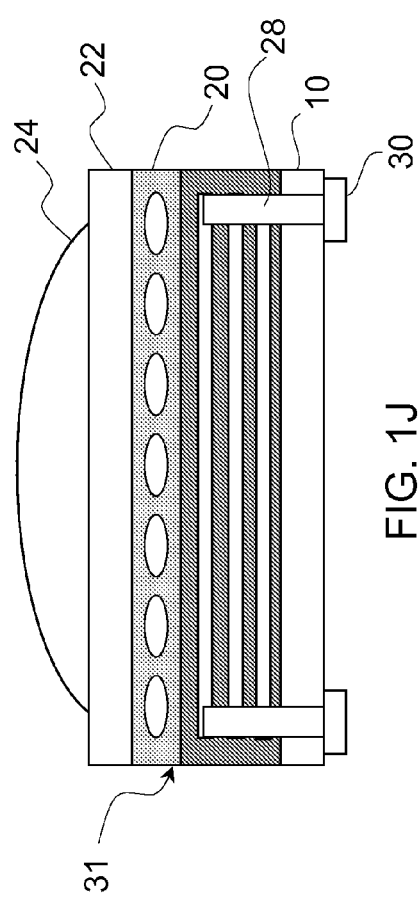
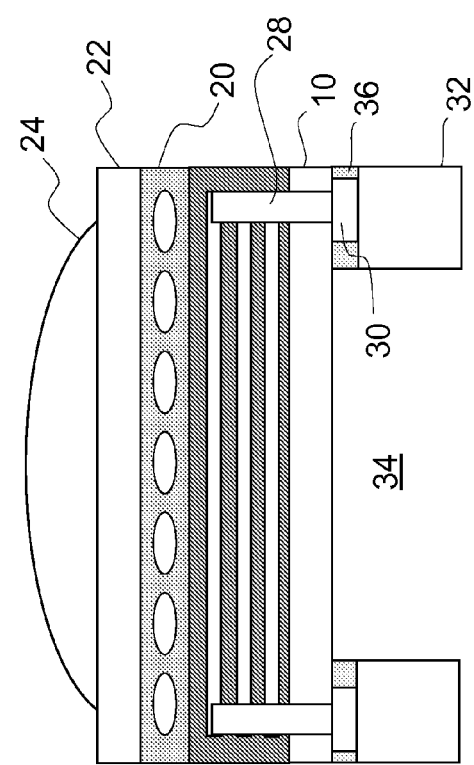

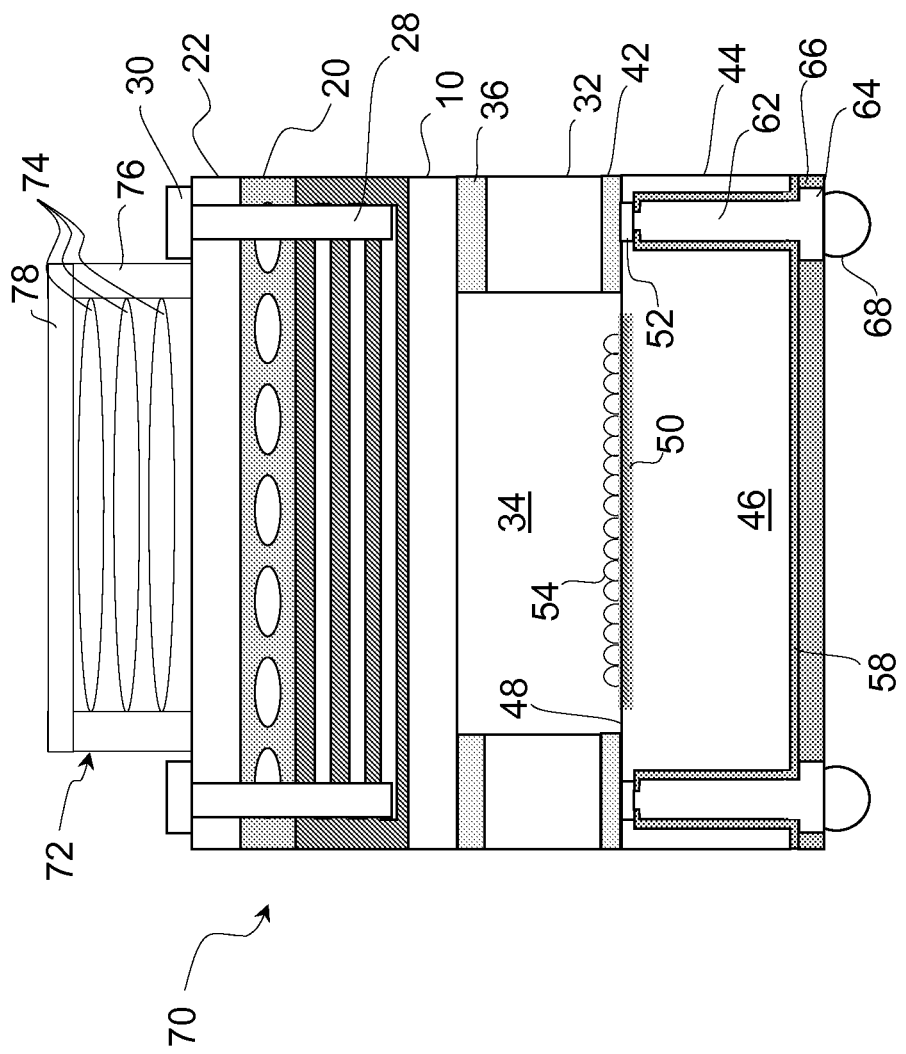

INTEGRATED IMAGE SENSOR PACKAGE WITH LIQUID CRYSTAL LENS

FIELD OF THE INVENTION

The present invention relates to an auto-focusing lens and packaging of microelectronic devices, and more particularly to the forming of an auto-focusing lens module integrated with an image sensor package.

BACKGROUND OF THE INVENTION

Conventional image sensors used for mobile application such as cell phone cameras use VCM actuators to adjust lens focus. The VCM actuator moves the lens closer or further from the image sensor to adjust focus, and is therefore large in size, mechanical, creates noise, and consumes a lot of power. Focusing can be slow with VCM actuator systems as the lens has to physically travel through the device. The VCM actuator uses an electric motor and gears, so naturally a large amount of power is consumed and the device is relatively noisy.

More recently, tunable lenses have been developed that can adjust the focal power or properties of the lens without physically moving any components (i.e. where the optical power of the lens is changed by applying an electric voltage or pulse to the lens). Optical power of a lens refers to the amount of focusing (e.g. convergence) that the lens imparts on light (or more specifically a light image) passing therethrough. An example of a tunable lens is tunable liquid crystal lens, which is a device in which a liquid crystal is employed to create the effect of a lens via electrical stimulus, and can be tuned to different optical powers by adjusting that electrical stimulus. A tunable liquid crystal lens achieves the effect of a lens by creating regions of differing indices of refraction in a liquid crystal when subjected to electrical stimulus. The tunable liquid crystal lens can be adjusted to different levels in a range of optical power by manipulating, for example, the voltages of the electrical signal applied to the lens. Tunable liquid crystal lenses consume less energy and can respond more quickly that those lenses with moving parts.

The present invention relates to the integration of a tunable liquid crystal lens with the image sensor package.

BRIEF SUMMARY OF THE INVENTION

A package structure that includes a sensor chip and a liquid crystal lens. The sensor chip includes a first substrate with front and back opposing surfaces, a plurality of photo detectors formed at the front surface, a plurality of contact pads formed at the front surface which are electrically coupled to the photo detectors, a plurality of first electrical contacts each extending from the back surface and through the first substrate to one of the contact pads, and a plurality of second electrical contacts each extending from the back surface and through the first substrate to the front surface. The liquid crystal lens includes a layer of liquid crystal material, one or more lead patterns adjacent the layer of liquid crystal material, and a plurality of third electrical contacts each extending from one of the one or more lead patterns. The sensor chip is mounted to the liquid crystal lens such that each of the third electrical contacts is electrically connected to one of the plurality of second electrical contacts and the plurality of photo detectors are disposed under the liquid crystal material for receiving light passing through the liquid crystal material.

A package structure that includes a sensor chip and a liquid crystal lens. The sensor chip includes a first substrate with front and back opposing surfaces, a plurality of photo detectors formed at the front surface, a plurality of contact pads formed at the front surface which are electrically coupled to the photo detectors, and a plurality of first electrical contacts each extending from the back surface and through the first substrate to one of the contact pads. The liquid crystal lens includes second and third substrates, a layer of liquid crystal material disposed between the second and third substrates, one or more lead patterns adjacent the layer of liquid crystal material and disposed between the second and third substrates, and a plurality of second electrical contacts each extending from one of the one or more lead patterns and through the second substrate. The front surface of the sensor chip is mounted to the third substrate of the liquid crystal lens such that the plurality of photo detectors are disposed under the liquid crystal material for receiving light passing through the liquid crystal material.

A package structure that includes a sensor chip and a liquid crystal lens. The sensor chip includes a first substrate with front and back opposing surfaces, a plurality of photo detectors formed at the back surface, a plurality of contact pads formed at the back surface which are electrically coupled to the photo detectors, and a plurality of first electrical contacts each extending from the back surface and through the first substrate to the front surface. The liquid crystal lens includes a layer of liquid crystal material, one or more lead patterns adjacent the layer of liquid crystal material, and a plurality of second electrical contacts each extending from one of the one or more lead patterns. The sensor chip is mounted to the liquid crystal lens such that each of the second electrical contacts is electrically connected to one of the plurality of first electrical contacts and the plurality of photo detectors are disposed under the liquid crystal material for receiving light passing through the liquid crystal material and through the front surface.

A package structure that includes a sensor chip and a liquid crystal lens. The sensor chip includes a first substrate with front and back opposing surfaces, a plurality of photo detectors formed at the back surface, and a plurality of contact pads formed at the back surface which are electrically coupled to the photo detectors. The liquid crystal lens includes second and third substrates, a layer of liquid crystal material disposed between the second and third substrates, one or more lead patterns adjacent the layer of liquid crystal material and disposed between the second and third substrates, and a plurality of first electrical contacts each extending from one of the one or more lead patterns and through the second substrate. The front surface of the sensor chip is mounted to the third substrate of the liquid crystal lens such that the plurality of photo detectors are disposed under the liquid crystal material for receiving light passing through the liquid crystal material and the front surface.

Other objects and features of the present invention will become apparent by a review of the specification, claims and appended figures.

BRIEF DESCRIPTION OF THE DRAWINGS

FIGS. 3A-3D are cross sectional side views showing in sequence the steps in the making of an alternate embodiment of the package structure of the present invention.

DETAILED DESCRIPTION OF THE INVENTION

Figure 1D:
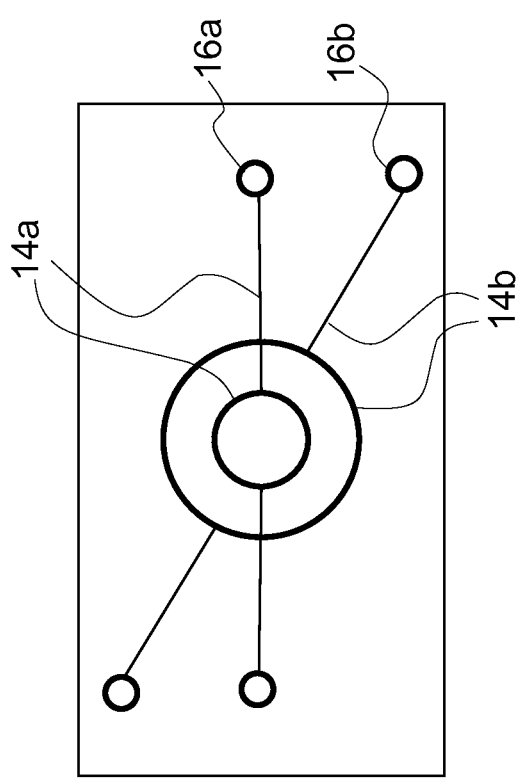
FIGS. 1A-1O are cross sectional side views or top views showing in sequence the steps in the making of the package structure of the present invention.

The present invention is an integrated image sensor package with tunable liquid crystal lens.

FIGS. 1A-1O illustrate the method of forming the integrated image sensor package. As illustrated in FIG. 1A, the method begins by depositing a dielectric layer 12 on an optically transparent substrate 10. The optically transparent substrate 10 can be polymer, glass, a combination of glass and polymer or any other transparent material. Preferably, the substrate 10 is glass. A preferred thickness of the optically transparent substrate 10 is 0.1 mm or more. Dielectric layer 12a can be omitted if the substrate provides sufficient insulation. Dielectric layer 12a can be made of polymer, polyimide, magnesium fluoride, calcium fluoride, silicon dioxide or any of various other type of thin film metal oxide that has suitable transparency and electrical insulation properties. The thickness of the dielectric layer 12a is preferably less than 200 nm, such as for example less than 30 nm. Preferably, dielectric layer 12 is made of silicon dioxide, and preferred thickness of the silicon dioxide layer 12a is 10-20 nm. The silicon dioxide can be deposited using chemical vapor deposition or sputtering.

A first conductive layer (electrically conductive lead pattern 14a and electrically conductive lead pads 16a) are then formed on dielectric layer 12a. The electrically conductive material for this layer is preferably optically transparent. Transparency and electric conductivity is achieved by using thin film materials such as titanium oxide, silver nanowire, indium tin oxide, zinc sulfide, zinc peroxide, gallium zinc oxide, graphene, carbon nanotube, aluminum zinc oxide, conductive polymers and various electric conductive transparent metallic oxides that are well known in the art. Preferably, electric conductive lead pattern 14a is formed using indium tin oxide that is 150 to 200 nm thick and less than 2 microns wide. Indium tin oxide can be deposited using electron beam evaporation, physical vapor deposition, or a range of sputter deposition techniques. Once a thin layer of indium tin oxide is deposited on top of the dielectric layer 12a, a lithographic etch process follows. Both maskless and masked lithography techniques can be used for this process, techniques such as electron beam, direct laser writing, focused ion beam, probe tip contact, aluminum mask and various types of photo masks. Glass photo mask is the preferred exposure technique for this process. A patterned photo resist layer is formed on top of the indium tin oxide layer; such masking layer can be dry film photo resist, or liquid (e.g. AZ type) photo resist or any other high resolution photo resists. For dry etch process; the photo resist can be substituted by an aluminum mask. After the photo resist is fully developed, a dry plasma etching process is used to etch away unwanted indium tin oxide, leaving lead pattern 14a and pads 16a. A dry plasma etching process can use the following gas: HBr, C3H6O—Ar—O2, C3H6O—HCFCs—O2, CH4-H2 or any other appropriate gas. Wet etching process can use the following etchant: "HCl—HNO3-H2O", "FeCl—HCl—H2O", "HCl—FeCl3-HNO3-H2O", "HF—H2O2-H2O", "HCl—H2O" or any other appropriate etchant. Lastly, the photo resist is striped by a wet chemical process or plasma. The resulting structure is shown in FIGS. 1B and 1C. The lead pattern 14a is shown to be, but need not necessarily be, a central circle with two lines extending to two pads 16a.

Figure 1E:
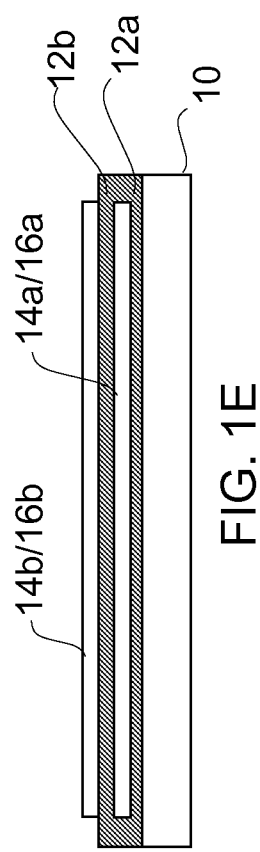

Another dielectric layer 12b is formed over the structure, followed by the formation of a second patterned conductive layer (i.e. forming lead pattern 14b and pads 16b) on layer 12b, using the same or similar techniques described above with respect to forming lead pattern 14a and pads 16a. Preferably, but not necessarily, lead pattern 14b includes a central circle (concentric around the circle of lead pattern 14a but of larger diameter) with two lines extending to two pads 16b. Dielectric layer 12b insulates lead pattern 14b from lead pattern 14a. The resulting structure is shown in FIGS. 1D and 1E.

Figure 1F:
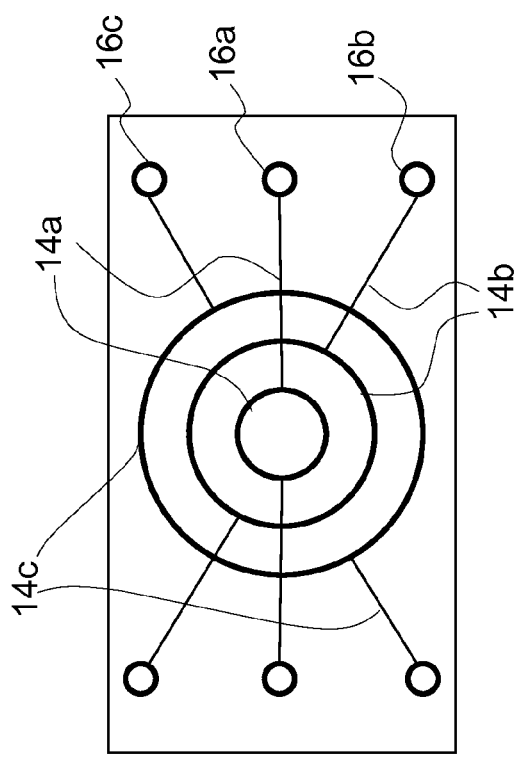
Figure 1G:
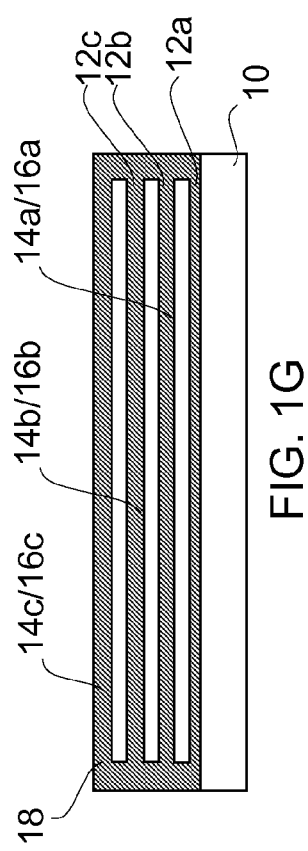

Another dielectric layer 12c is formed over the structure, followed by the formation of a third patterned conductive layer (i.e. forming lead pattern 14c and pads 16c) on layer 12c, using the same or similar techniques described above. Preferably, but not necessarily, lead pattern 14c includes a central circle (concentric around the circles of lead patterns 14a/14b but of larger diameter) with two lines extending to two pads 16c. Dielectric layer 12c insulates lead pattern 14c from lead pattern 14b. An optional dielectric layer 18 is formed over the structure. The resulting structure is shown in FIGS. 1F and 1G. While three patterned conductive layers are illustrated, fewer or additional patterned conductive layers can be utilized depending upon the application, size and operation requirements of the lens modules. Most applications would likely require at least two such patterned conductive layers.

Figure 1H:
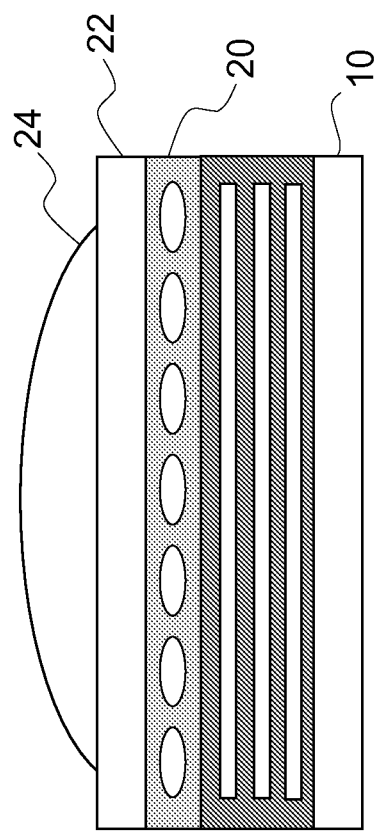

A sheet of liquid crystal material 20 is laminated on top of the structure (i.e. on top of dielectric layer 18 if used) using any appropriate lamination technique. Sheets of liquid crystal material are well known in the art, and not further described herein. An optically transparent substrate 22 is mounted on top of the liquid crystal sheet 20. The optically transparent substrate 22 can be polymer, glass, a combination of glass and polymer or any other transparent material. Preferably, the substrate 22 is glass with a thickness of 50 μm or more. The optically transparent substrate 22 is bonded on top of the liquid crystal sheet 20 using optically transparent adhesive material and a spin & pressure bonding process. An optional layer of anti-reflective coating or infrared coating can be deposited on the optically transparent substrate 22. An optional optical element 24 such as lens can be integrated with, formed on or attached to optically transparent substrate 22. The resulting structure is shown in FIG. 1H.

Figure 1I:
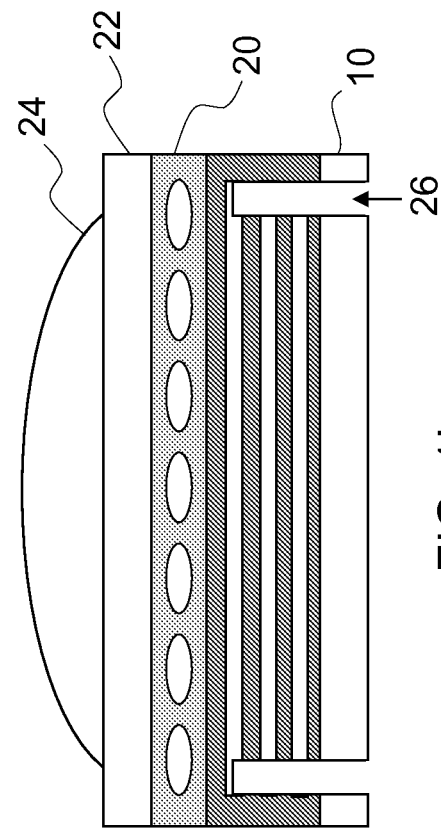

A plurality of holes 26 are next formed into the surface of substrate 10 that extend into insulation 12, as illustrated in FIG. 1I. Each hole 26 is preferably aligned with and exposes one of the pads 16. Holes 26 can be formed by laser, etch, mechanical milling or any other appropriate hole forming method(s). Electrically conductive material is then deposited inside the holes 26 to form electrical contacts 28 each extending from one of the pads 16 to the surface of substrate 10. The electrical contacts 28 can terminate in leads 30 at the surface of substrate 10 over holes 26. Alternately, some or all of the leads 30 can extend along the surface of substrate 10 to re-route the position along the surface of substrate 10 at which an electrical connection to the lead 30 can take place (i.e.

away from the holes 26 from which the electrical contacts 28 extend). Electrically conductive material used to form contacts 28 and/or leads 30 can include copper, aluminum, polymer or any other appropriate electric conductive material(s). Electrically conductive material used to form contacts 28 and/or leads 30 can be deposited by electro plating, sputtering, chemical vapor deposition or any other appropriate deposition method(s). Leads 30 that rerouted contact position can be formed using an appropriate lithography and etching processes. The resulting tunable liquid crystal lens structure 31 is illustrated in FIG. 1J.

A spacer 32 is bonded on the surface of substrate 10 (i.e. bonded to the leads 30. Spacer 32 can be polymer, metallic, ceramic, glass, silicon and pre-preg, Teflon, polymer, photo resist, epoxy, a combination of aforementioned materials or any other appropriate material(s). Preferably, a sheet of dry film photo-imagable material is used as spacer 32, whereby a dry film is laminated onto substrate 10 and/or leads 30, then exposed and developed such that a central portion of the material is removed (i.e. leaving a cavity 34). The thickness of spacer material can be in the range of 0.01 mm to 2.0 mm. A joining interface material 36 can be formed between spacer 32 and substrate 10, and can be polyimide, resin, epoxy based or any other appropriate joining material(s). Joining interface material 36 is optional depending on the material used for spacer 32. The resulting structure is shown in FIG. 1K.

Figure 1L:
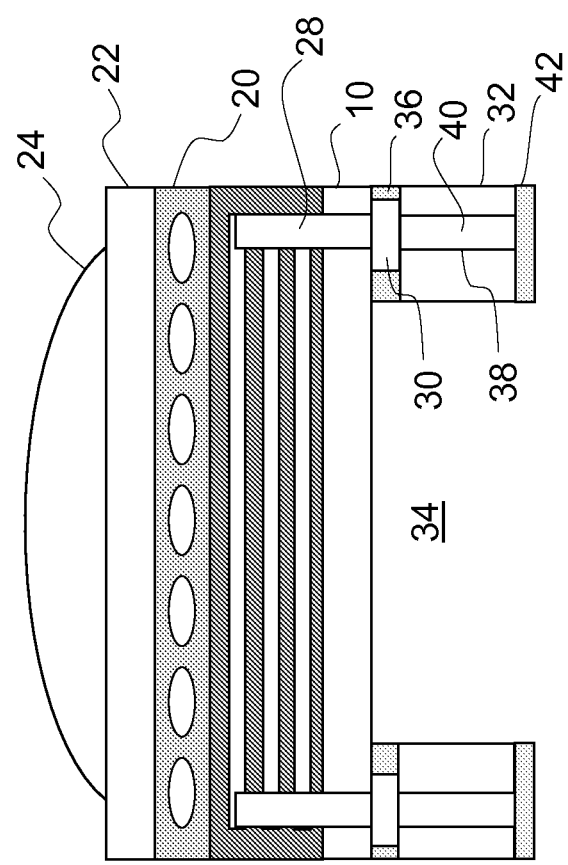

A plurality of holes 38 are formed through the spacer 32 to expose leads 30. Holes 38 can be formed by laser, etch, mechanical milling or any other appropriate hole forming method(s). Electrically conductive material is then deposited inside the holes 38 to form electrical contacts 40 that extend through spacer 32. The electrically conductive material can be copper, aluminum, polymer or any other appropriate electric conductive material(s), and can be deposited by plating, sputtering, chemical vapor deposition, mask screen printing or any other appropriate deposition method(s). An adhesive layer 42 is deposited on the bottom surface of the spacer 32. The adhesive layer 42 can be formed of an epoxy, with a thickness in range of 0.1 µm to 20 µm. The adhesive layer 42 can be deposited on the spacer 32 using a roller technique or other conventional dispense methods. The resulting structure is shown in FIG. 1L.

Figure 1M:
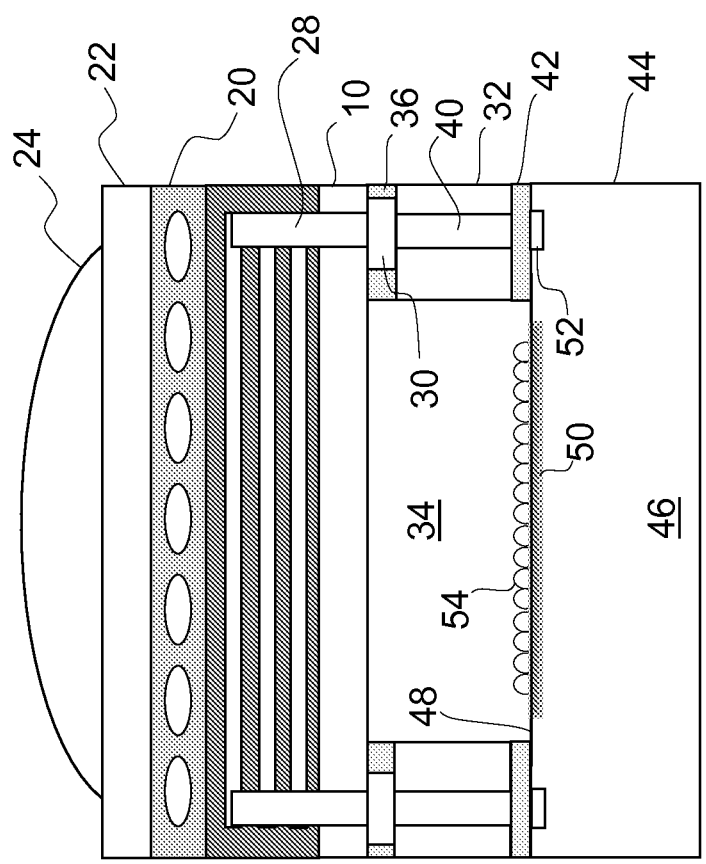

The bottom surface of spacer 32 is then bonded to the active side (imaging area) of an image sensor chip 44 using adhesive layer 42, as illustrated in FIG. 1M. Bonding can be done using any conventional bonding processes. A bonder that introduces physical pressure, heat and vacuum is preferred. Image sensor chip 44 includes a wafer substrate 46 having a front surface 48. A plurality of photo detectors 50 and supporting circuitry are formed, along with contact pads 52, at the upwardly facing (front) surface 48 of wafer substrate 46. The contact pads 52 are electrically connected to the photo detectors 50 (and/or their supporting circuitry) for providing off chip signaling. Each photo detector 50 converts light energy to a voltage signal. Additional circuitry may be included to amplify the voltage, and/or convert it to digital data. Color filters and/or microlenses 54 can be mounted over the photo detectors 50. Sensors of this type are well known in the art, and not further described herein.

Figure 1N:
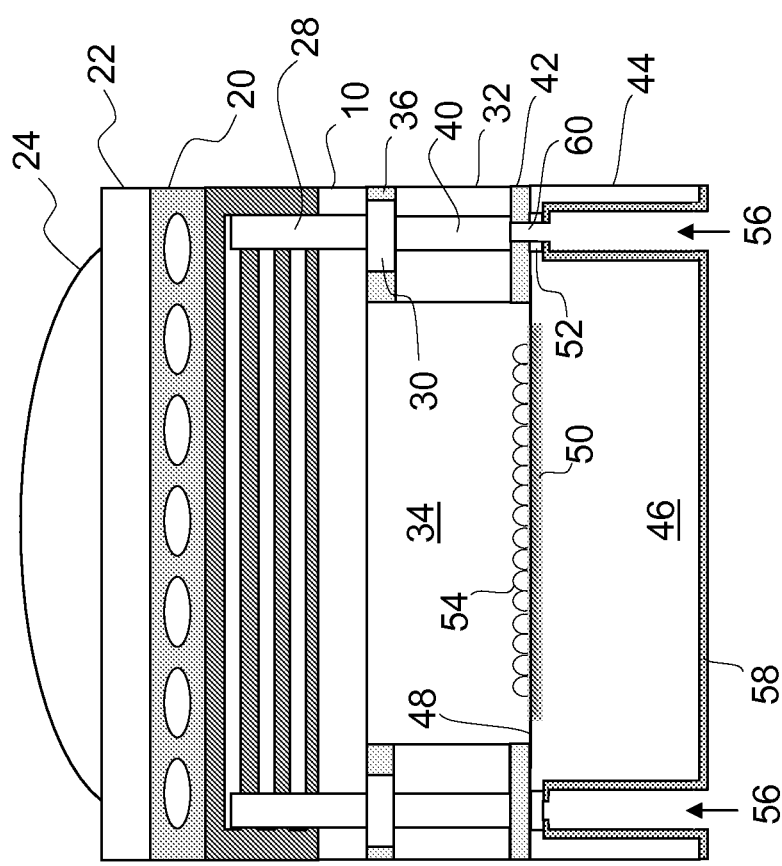

Holes 56 are formed into the back surface of the wafer substrate 46. Some of the holes 56 are aligned with contact pads 52, where each such hole 56 extends to (and exposes) one of the contact pads 52. Other holes 56 are not aligned with contact pads 52, where each such hole 56 extends to and exposes adhesive layer 42. Holes 56 can be formed by laser, plasma etch, mechanical milling or any other appropriate hole forming method. A dielectric material 58 is then deposited or formed on the sidewalls of holes 56 and on the back surface of wafer substrate 46. Dielectric material 58 can be silicon dioxide, silicon nitride, epoxy, polyimide, resin, metallic oxides or any other appropriate dielectric material(s). Preferably, dielectric material 58 is silicon dioxide, deposited using a sputtering or chemical vapor deposition technique. A preferred thickness of dielectric material 58 is 0.1 µm or more. For some of the holes 56 that are aligned with contact pads 52, the dielectric material at the bottom of the hole is removed (if it exists) so that the contact pad 52 is left exposed at the bottom of each hole 56 (e.g. see the left hand hole 56 in FIG. 1N). For others of the holes 56 that are aligned with contact pads 52, the hole 56 is extended by forming a small hole 60 through dielectric material 58, through contact pad 52, and through adhesive layer 42, to expose electrical contact 40 (e.g. see the right hand hole 56 in FIG. 1N). Finally, for holes 56 that are not aligned with any of the contact pads 52, the holes 56 are extended by forming the small hole 60 through delectric material 58 and through adhesive layer 42, to expose electrical contact 40. Holes 60 can be formed by laser, etch, mechanical milling or any other appropriate via forming method(s). The resulting structure is shown in FIG. 1N.

Electrically conductive material is then deposited inside holes 56 and 60 to form electrical contacts 62 therein. Some of the electrical contacts 62 extend from the bottom surface of wafer substrate 46 to one of the contact pads 52 (e.g. see the left hand contact 62 in FIG. 1O). Others of the electrical contacts 62 extend from the surface of wafer substrate 46, through one of the contact pads 52 (making electrical contact therewith), through adhesive layer 42 and to electrical contact 40 (e.g. see the right hand contact 62 in FIG. 1O), whereby electrical contacts 28, 40 and 62 constitute an electrical contact that extends from a lead pattern 14 of the TLC lens 31 to the bottom of image sensor chip 44 and making electrical contact with the intermediary contact pad 52 of the image sensor chip. Still others of the electrical contacts 62 extend from the surface of wafer substrate 46, through adhesive layer 42 and to electrical contact 40 (i.e. not making any contact with any of the contact pads 52), whereby electrical contacts 28, 40 and 62 constitute an electrical contact that extends from a lead pattern 14 of the TLC lens 31 to the bottom of image sensor chip 44 (without making any electrical contact with any intermediary contact pad 52 of the image sensor chip). The electrically conductive material can be copper, aluminum, polymer or any other appropriate electric conductive material(s), and can be deposited by electro plating, sputtering, chemical vapor deposition, screen printing or any other appropriate deposition method(s). The electrically conductive material can extend out of holes 56 and along the surface of the wafer substrate 46, whereby following lithographic and etching processes, each electrical contact 62 terminates in a contact pad 64. An encapsulant dielectric layer 66 is deposited on layer 58 in a manner that keeps contact pads 64 exposed. Encapsulant layer 66 can be polymer, epoxy, metallic oxide, resin or any other appropriate encapsulant material(s). Encapsulant layer is preferably at least 0.5 µm in thickness. Ball Grid Array (BGA) or Land Grid Array contacts 68 are then formed on the contact pads 64 using screen printing or any appropriate BGA forming methods. The final integrated packaging structure 70 is shown in FIG. 1O. If a plurality of packaging structures 70 are formed together on a single substrate (which is more efficient that individual manufacture), the various structures 70 are separated from each other using mechanical blade dicing equipment, a laser, or any other appropriate dicing/singulation technique.

Integrated packaging structure 70 provides a compact packaging that integrates a liquid crystal lens with an image sensor chip while providing three different types of electrical contacts at a single surface (i.e. at the bottom surface of the image sensor chip 44). Specifically, a first type of BGA contact 68 provides electrical connectivity to just one of the contact pads 52 (via contact pad 64 and electrical contact 62, for supplying off chip connectivity for the image sensor chip). A second type of BGA contact 68 provides electrical connectivity to one of the liquid crystal lens pads 16 (via contact pad 64, electrical contact 62, electrical contact 40, lead 30 and electrical contact 28, for supplying drive signals to the corresponding lead pattern 14). A third type of BGA contact 68 provides electrical connectivity to both one of the contact pads 52 and one of the liquid crystal lens pads 16 (via contact pad 64, electrical contact 62, electrical contact 40, lead 30 and electrical contact 28), for supplying common signals to both the image sensor chip 44 and the liquid crystal lens 31 such as power, ground, etc.

Figure 2:
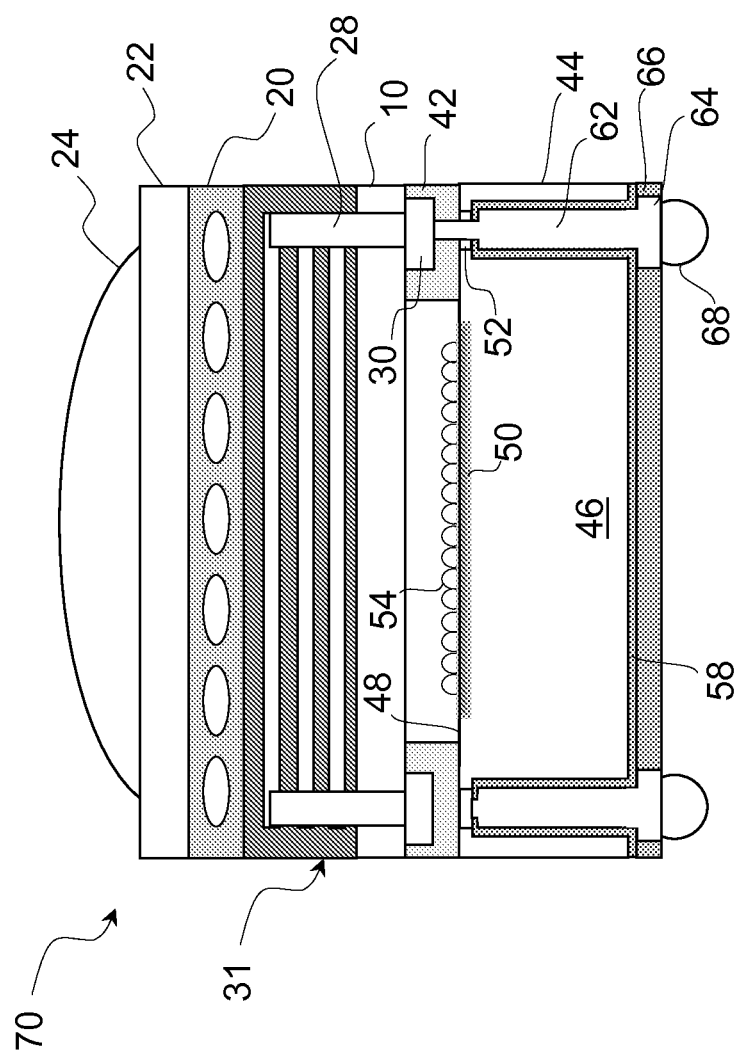
FIG. 2 is a cross sectional side view of an alternate embodiment to the package structure of FIG. 1O.

FIG. 2 illustrates an alternate embodiment to that shown in FIG. 1O. Specifically, the embodiment of FIG. 2 is the same as that of FIG. 1O except that spacer 32 (and the electrical contacts formed therethrough) and joining interface material 36 have been omitted. Instead, the thickness of adhesive layer 42 is sufficient (e.g. in range of 1 μm to 20 μm) to maintain a tolerable distance between the facing surfaces of tunable liquid crystal lens assembly 31 and image sensor chip 44.

Figure 3A:
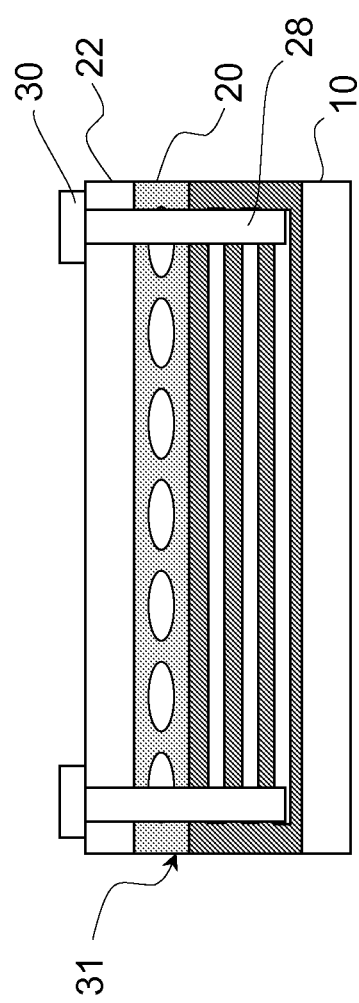

FIGS. 3A-3D illustrate the method of forming a second alternate embodiment of the integrated image sensor package. As illustrated in FIG. 3A, the method begins with the same structure as FIG. 1J, except holes 26 are formed into the surface of substrate 22 instead of substrate 10, whereby leads 30 are formed on the surface of substrate 22 instead of n the surface of substrate 10 (i.e. electrical contacts 28 extend up and through substrate 22 instead of down and through substrate 10). Optional optical element 24 is omitted for clarity.

Figure 3B:
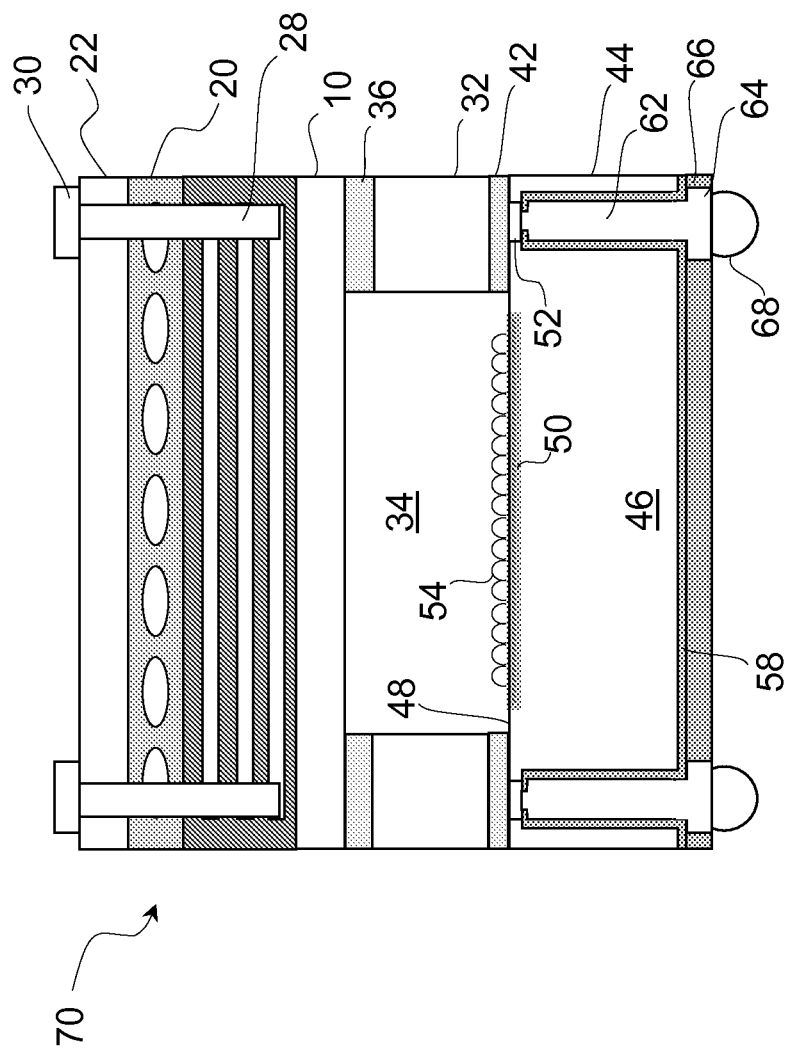

Next, the same processing steps as described above with respect to FIGS. 1K to 1O are performed (e.g. adding joining interface 36, spacer 32, adhesive layer 42 and image sensor chip 44), except that electrical contacts 40 are not formed in spacer 32, and electrical contacts 62 are formed to make contact with contact pads 52, and not to extend through contact pads 52. The resulting structure is shown in FIG. 3B.

As with the earlier embodiments, an optional optical element 24 can be integrated with, formed on or attached to optically transparent substrate 22. Optical element could be a single optic such as lens as shown for example in FIG. 1H, or can be a multi-element optical element such as a lens module having a plurality of lenses as shown in FIG. 3C. Specifically, lens module 72 includes a plurality of lenses 74 inside a housing 76, disposed underneath a transparent substrate 78. The lens module 72 can be mounted on substrate 22.

Figure 3D:
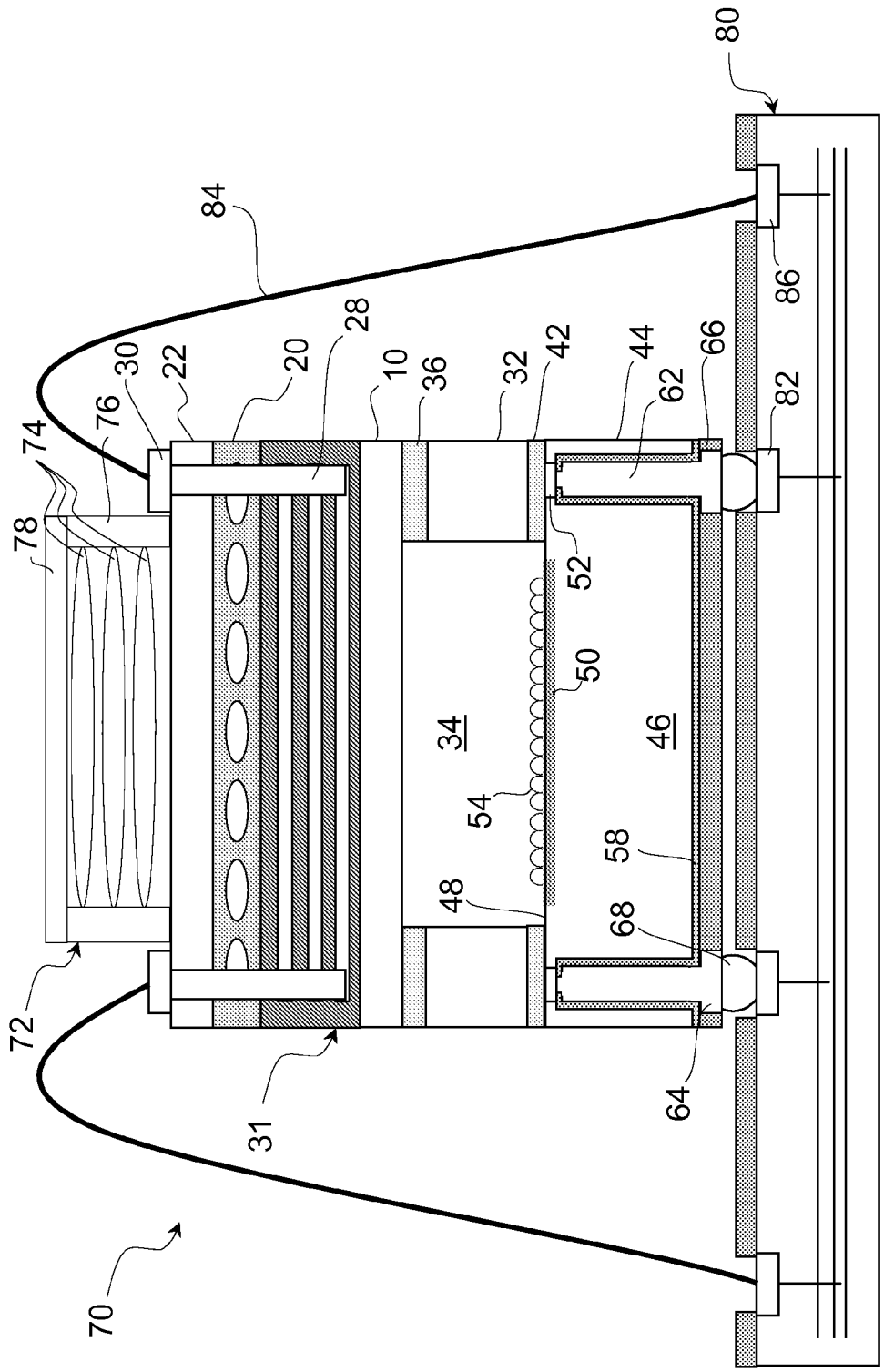

The packaging structure 70 can be mounted to a printed circuit board 80 as illustrated in FIG. 3D. Specifically, BGA contacts 68 can be mounted to PCB contacts 82 for electrically connecting image sensor chip 44 to PCB 80. Additionally, wires 84 can be connected between leads 30 and PCB contacts 86 for electrically connecting the liquid crystal lens 31 to PCB 80.

Figure 4:
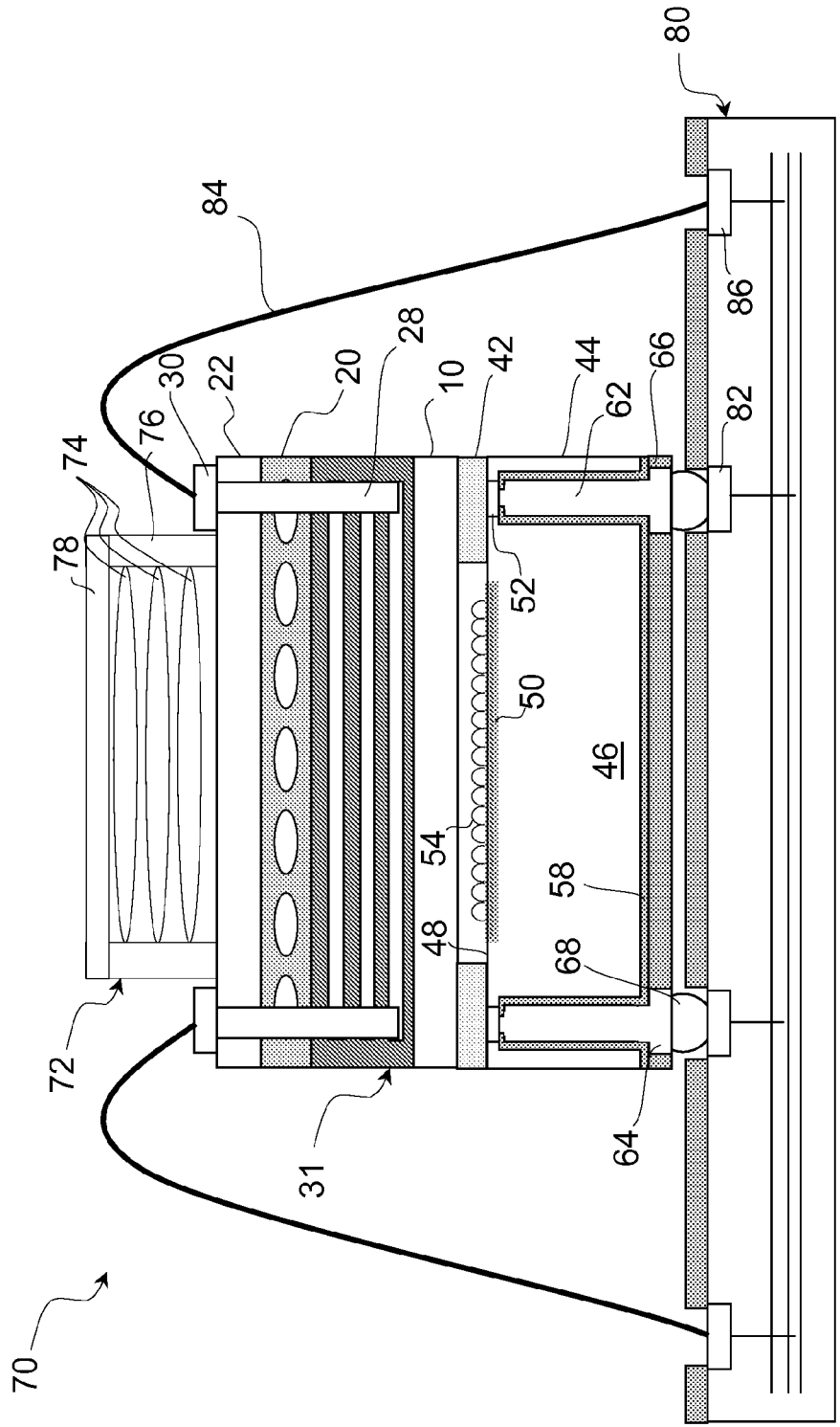
FIG. 4 is a cross sectional side view of an alternate embodiment to the package structure of FIG. 3D.

FIG. 4 illustrates an alternate embodiment to that shown in FIG. 3D. Specifically, the embodiment of FIG. 4 is the same as that of FIG. 3D except that spacer 32 and joining interface material 36 have been omitted. Instead, the thickness of adhesive layer 42 is sufficient (e.g. in range of 1 μm to 20 μm) to maintain a tolerable distance between the facing surfaces of tunable liquid crystal lens assembly 31 and image sensor chip 44.

Figure 5:
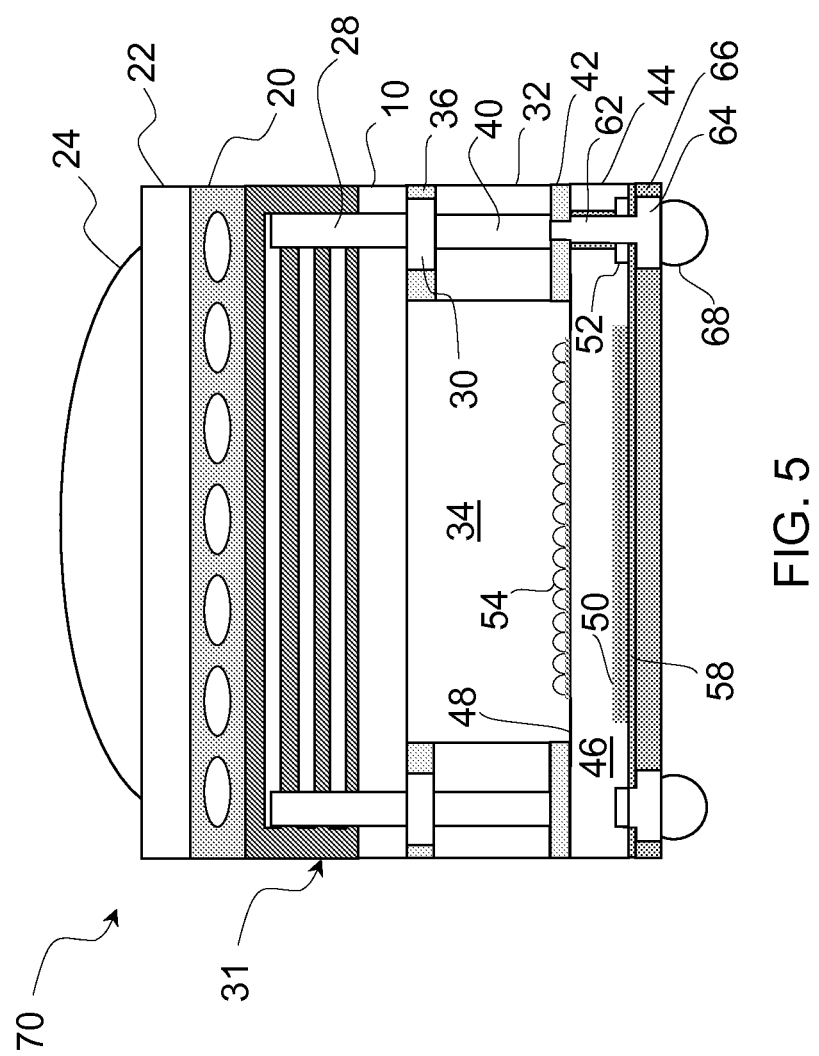
FIG. 5 is a cross sectional side view of an alternate embodiment to the package structure of FIG. 1O.
Figure 6:
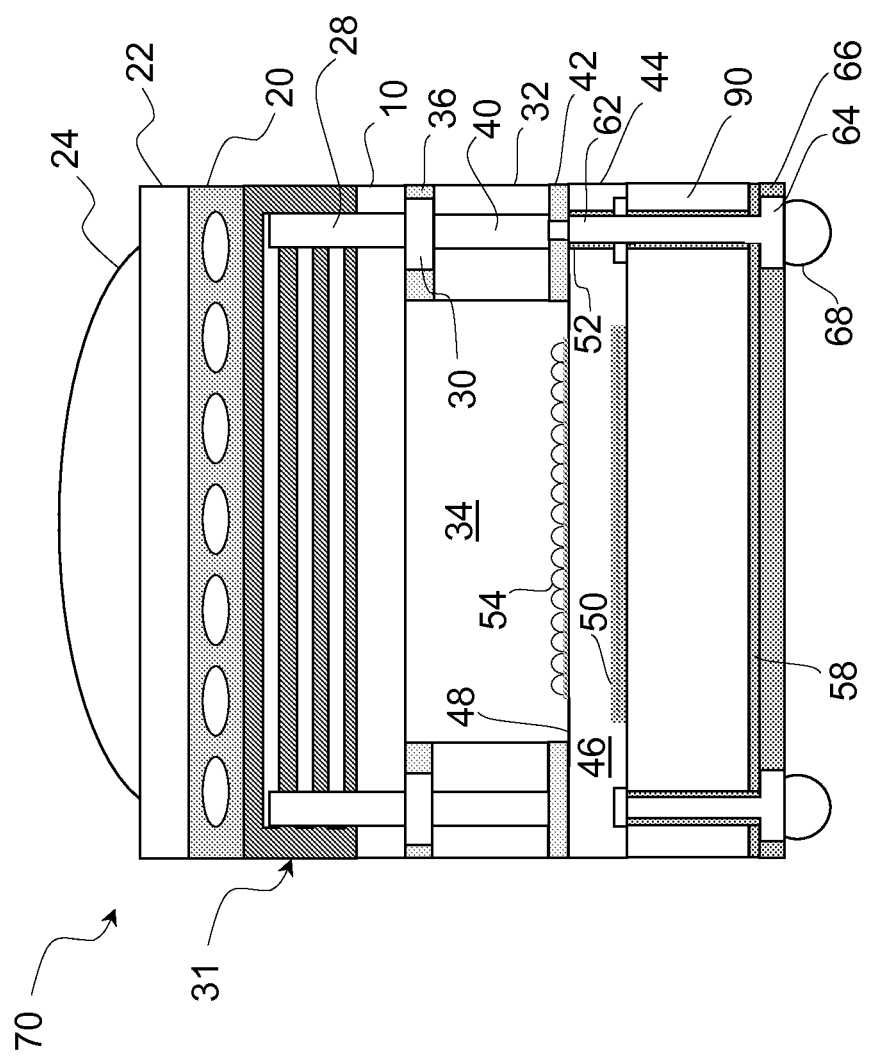
FIG. 6 is a cross sectional side view of an alternate embodiment to the package structure of FIG. 1O.
Figure 7:
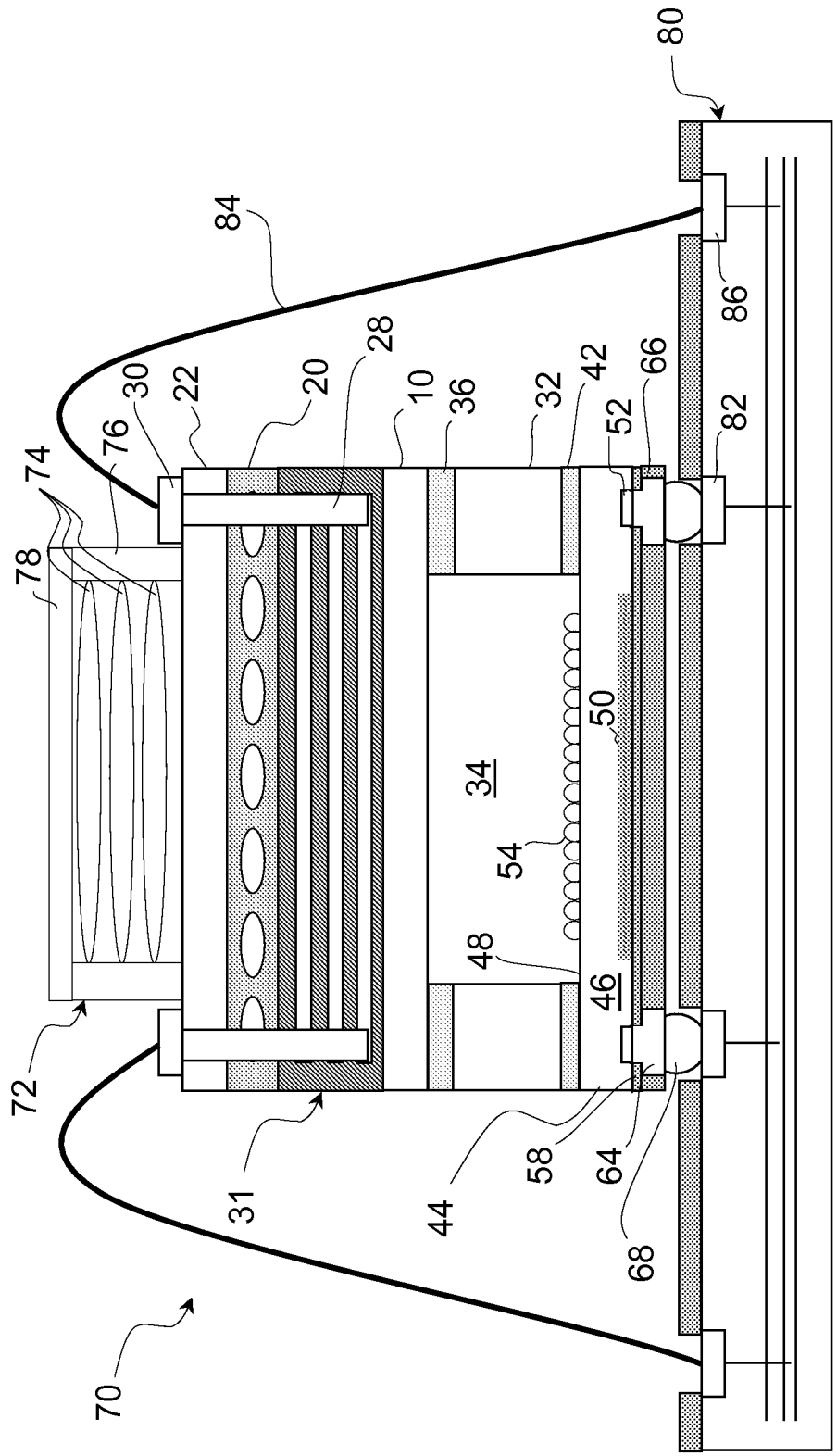
FIG. 7 is a cross sectional side view of an alternate embodiment to the package structure of FIG. 3D.
Figure 8:
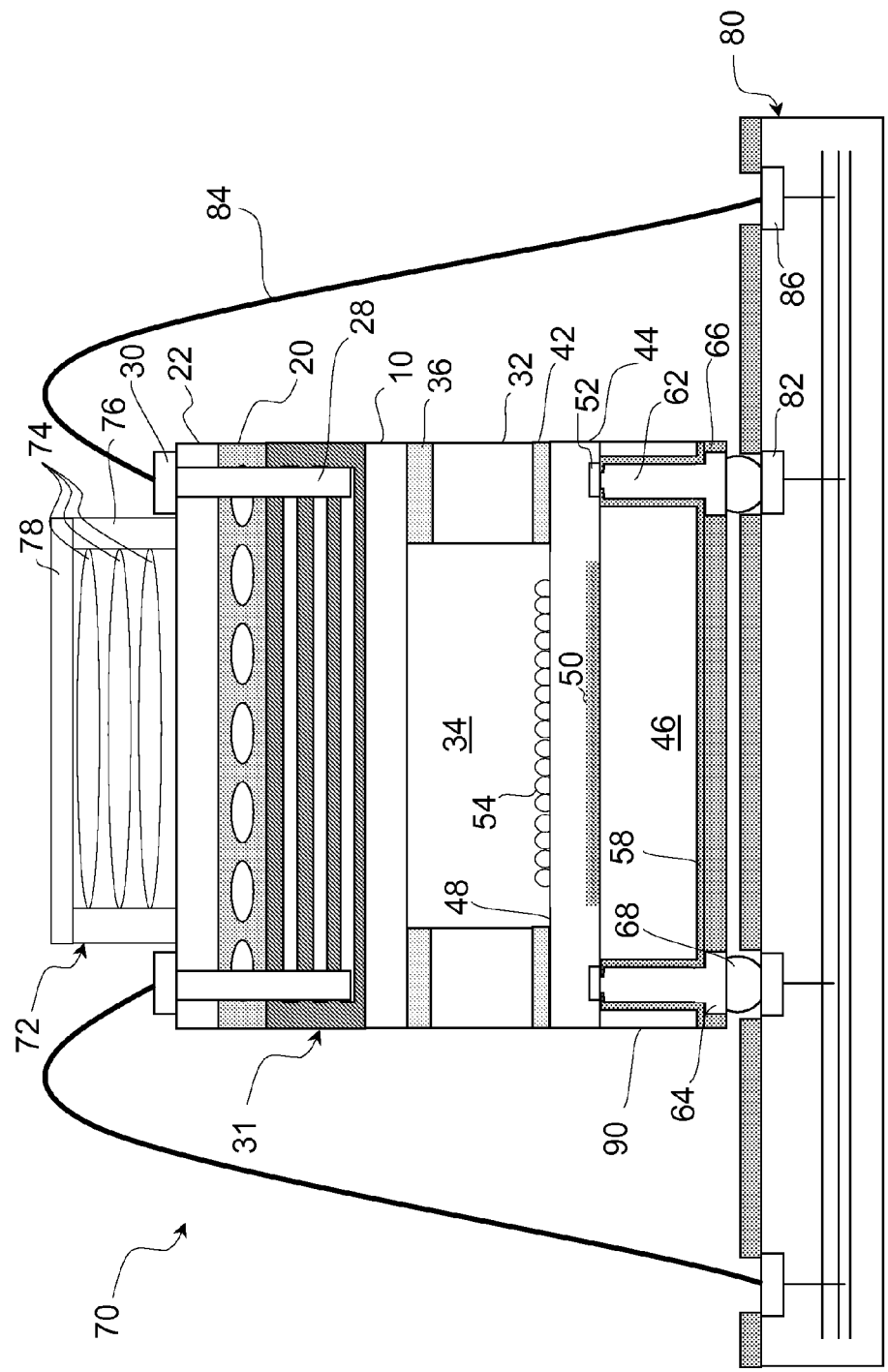
FIG. 8 is a cross sectional side view of an alternate embodiment to the package structure of FIG. 3D.

The present invention can also utilize back side illuminated (BSI) image sensor chips, which have the photo detectors 20 and contact pads 52 formed on the opposite surface through which the light enters (and on which the color filters and microlenses 54 are mounted). FIG. 5 illustrates an alternate embodiment to that shown in FIG. 1O, in which the photo detectors 50 and contact pads 52 are formed on the bottom surface of wafer substrate 46, and the color filters and microlenses 54 are mounted to the top surface of wafer substrate. With this configuration, the first type of BGA contact omits the electrical contact 62 (in connecting contact pad 64 to contact pad 52), and the third type of BGA contact still provides electrical connectivity to both one of the contact pads 52 and one of the liquid crystal lens pads 16 (i.e. by being formed through or adjacent contact pad 52). With BSI image sensor chips, wafer substrate 46 can be thinned to minimize transmission loss through substrate 46 (as shown in FIG. 5). For additional mechanical support, the wafer substrate 46 can be mounted to a silicon handler 90 using a bonding material, as illustrated in FIG. 6. With this configuration, electrical contacts 62 are formed through and insulated from handler 90, and dielectric material layers 58/68, contact pads 64 and BGA contacts are formed on the bottom surface of handler 90. FIGS. 7 and 8 illustrate alternate embodiments to that shown in FIG. 3D, with BSI images sensor chips without and with handler 90, respectively.

Figure 10:
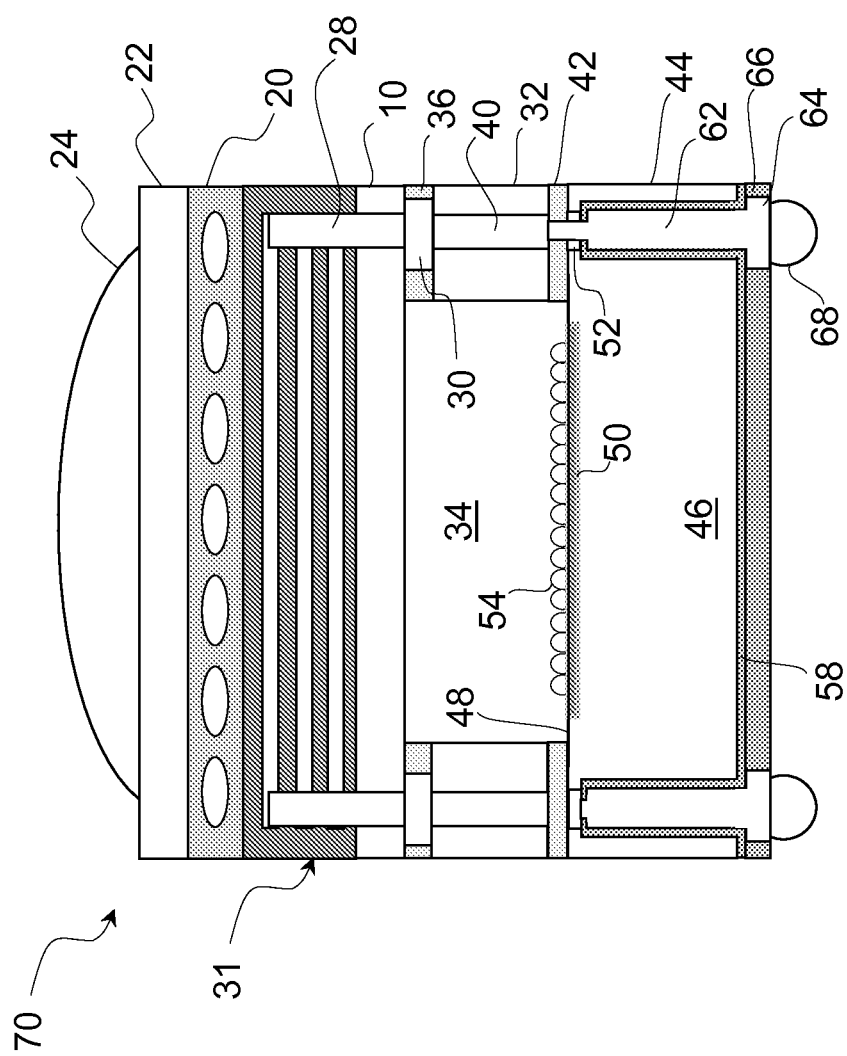
FIG. 10 is a cross sectional side view of an alternate embodiment to the package structure of FIG. 1O.
Figure 9:
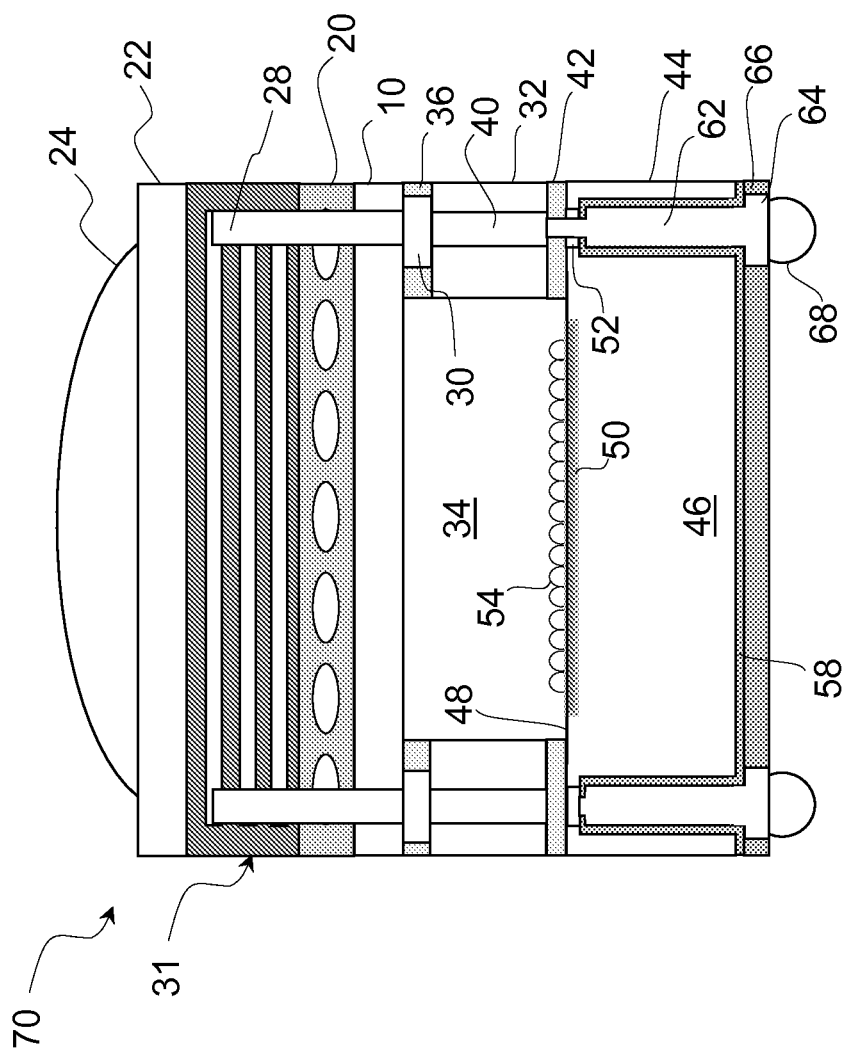
FIG. 9 is a cross sectional side view of an alternate embodiment to the package structure of FIG. 1O.
Figure 10:
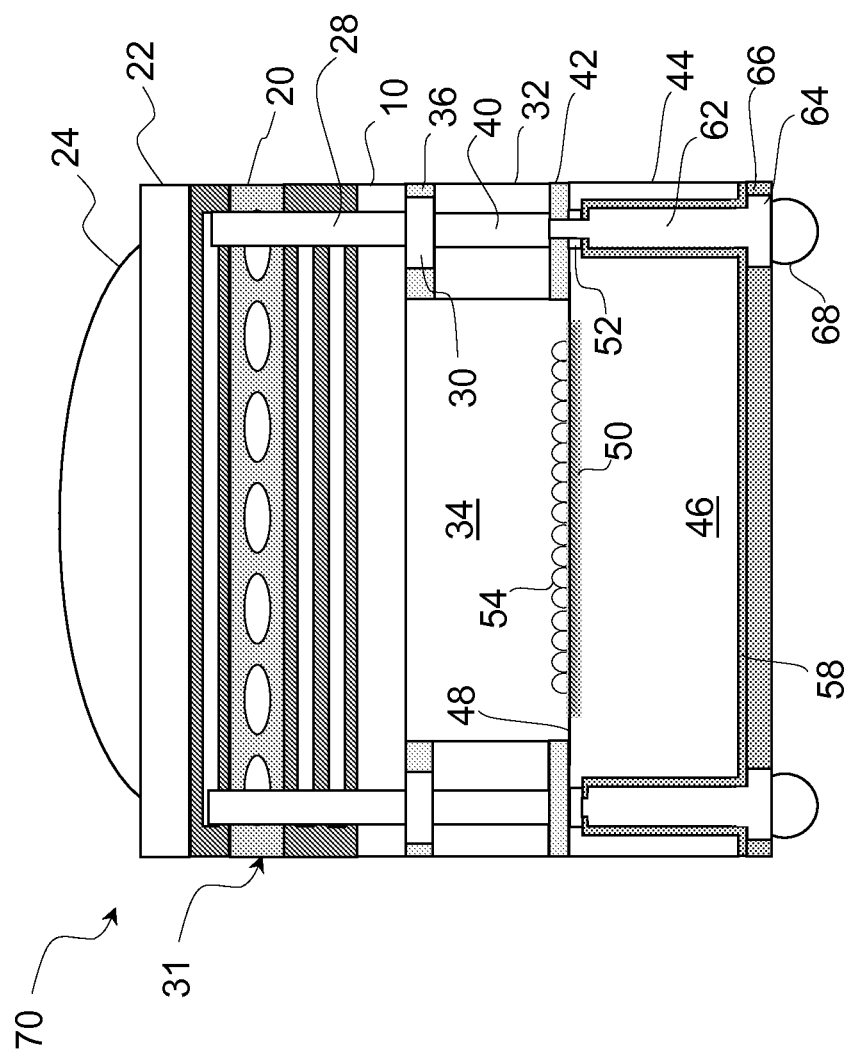
Figure 11:
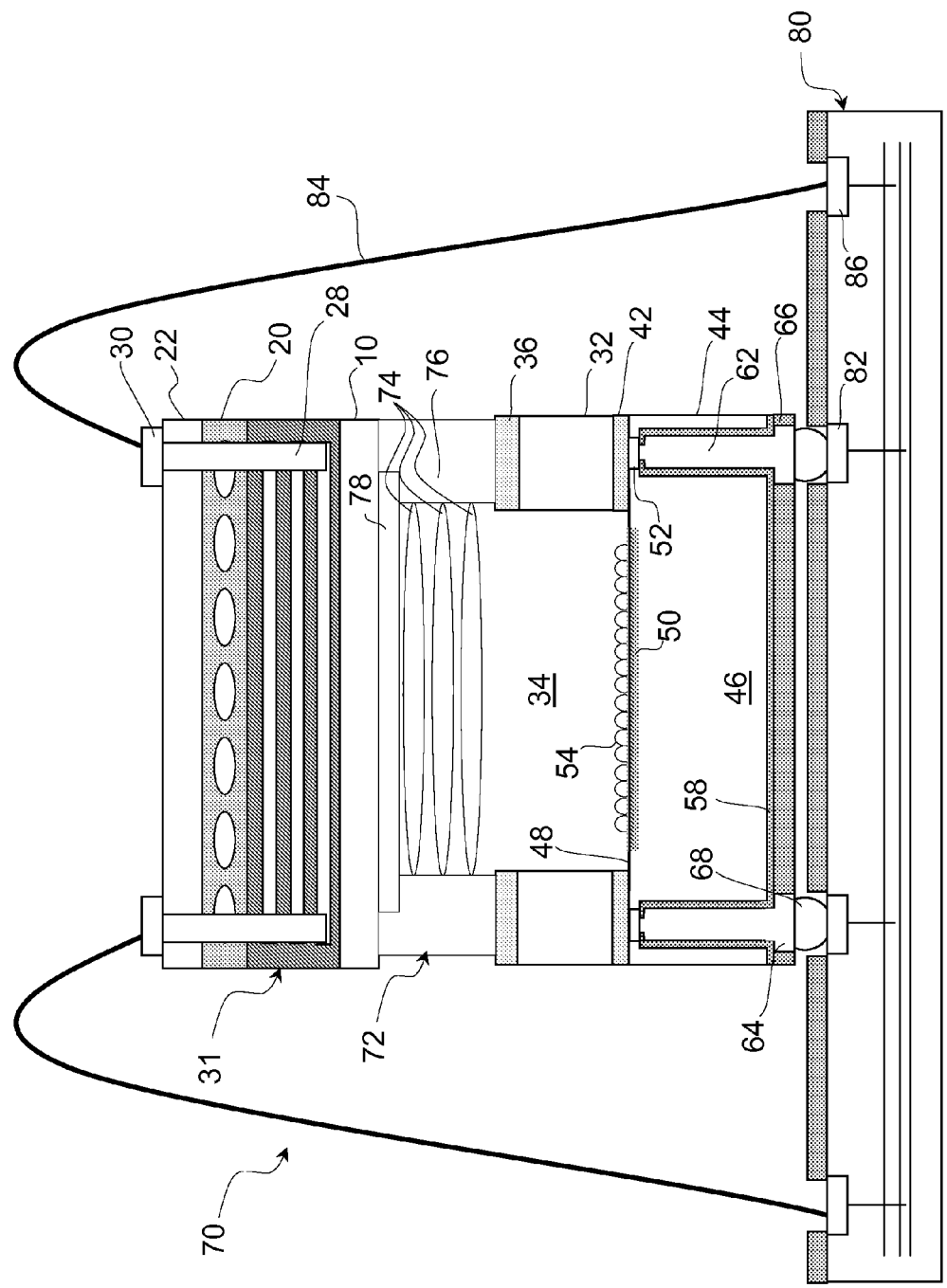
FIG. 11 is a cross sectional side view of an alternate embodiment to the package structure of FIG. 8.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaging structure of the present invention. Single layers of material could be formed as multiple layers of such or similar materials, and vice versa, and/or can be reversed in order. For example, the relative positioning of lead patterns 14 and sheet of liquid crystal material 20 can be reversed (see FIG. 9), or the lead patterns 14 can be on both sides of the sheet of liquid crystal material (see FIG. 10). The relative positioning of tunable liquid crystal lens structure 31 and lens module 72 can be reversed (e.g. see FIG. 11 in which the tunable liquid crystal lens structure 31 can be mounted over lens module 72.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A package structure, comprising:
a sensor chip that includes:
a first substrate with front and back opposing surfaces,
a plurality of photo detectors formed at the front surface,
a plurality of contact pads formed at the front surface which are electrically coupled to the photo detectors,
a plurality of first electrical contacts each extending from the back surface and through the first substrate to one of the contact pads, and
a plurality of second electrical contacts each extending from the back surface and through the first substrate to the front surface;
a liquid crystal lens that includes:
a layer of liquid crystal material,
one or more lead patterns adjacent the layer of liquid crystal material, and
a plurality of third electrical contacts each extending from one of the one or more lead patterns;
wherein the sensor chip is mounted to the liquid crystal lens such that each of the third electrical contacts is electrically connected to one of the plurality of second electrical contacts and the plurality of photo detectors are disposed under the liquid crystal material for receiving light passing through the liquid crystal material.

2. The package structure of claim 1, wherein at least one of the second electrical contacts is in electrical contact with one of the contact pads.

3. The package structure of claim 1, wherein at least one of the second electrical contacts is formed through, and in electrical contact with, one of the contact pads.

4. The package structure of claim 1, wherein the sensor chip is mounted to the liquid crystal lens by a spacer which is disposed between the sensor chip and the liquid crystal lens, and wherein the spacer includes a plurality of fourth electrical contacts each extending through the spacer and each electrically connected between one of the plurality of third electrical contacts and one of the plurality of second electrical contacts.

5. The package structure of claim 4, wherein the spacer comprises a cavity disposed over the plurality of photo detectors.

6. The package structure of claim 1, wherein the liquid crystal lens further comprises:
a second substrate adjacent the one or more lead patterns and the layer of liquid crystal material, wherein each of the third electrical contacts extends through the second substrate.

7. The package structure of claim 6, wherein the second substrate is optically transparent.

8. The package structure of claim 6, wherein the liquid crystal lens further comprises:
a third substrate, wherein the one or more lead patterns and the layer of liquid crystal material are disposed between the second and third substrates.

9. The package structure of claim 8, wherein the liquid crystal lens further comprises:
a lens module mounted to one of the second substrate and the third substrate, wherein the lens module includes a plurality of lenses therein.

10. The package structure of claim 9, wherein the sensor chip is mounted to the liquid crystal lens such that the lens module is disposed between the sensor chip and the liquid crystal lens.

11. The package structure of claim 6, wherein the liquid crystal lens further comprises:
an optical element mounted to one of the second substrate and the third substrate.

12. The package structure of claim 1, wherein the sensor chip is mounted to the liquid crystal lens by a layer of adhesive which is disposed between the sensor chip and the liquid crystal lens, and wherein the electrical connections between the third electrical contacts and the second electrical contacts is through the adhesive.

13. A package structure, comprising:
a sensor chip that includes:
a first substrate with front and back opposing surfaces,
a plurality of photo detectors formed at the front surface,
a plurality of contact pads formed at the front surface which are electrically coupled to the photo detectors, and
a plurality of first electrical contacts each extending from the back surface and through the first substrate to one of the contact pads;
a liquid crystal lens that includes:
second and third substrates,
a layer of liquid crystal material disposed between the second and third substrates,
one or more lead patterns adjacent the layer of liquid crystal material and disposed between the second and third substrates, and
a plurality of second electrical contacts each extending from one of the one or more lead patterns and through the second substrate;
wherein the front surface of the sensor chip is mounted to the third substrate of the liquid crystal lens such that the plurality of photo detectors are disposed under the liquid crystal material for receiving light passing through the liquid crystal material.

14. The package structure of claim 13, wherein the front surface of the sensor chip is mounted to the third substrate of the liquid crystal lens by a spacer which is disposed between and attached to the front surface of the sensor chip and the third substrate of the liquid crystal lens.

15. The package structure of claim 14, wherein the spacer comprises a cavity disposed over the plurality of photo detectors.

16. The package structure of claim 13, wherein the second and third substrates are optically transparent.

17. The package structure of claim 13, wherein the liquid crystal lens further comprises:
an optical element mounted to the second substrate.

18. The package structure of claim 13, wherein the liquid crystal lens further comprises:
a lens module mounted to one of the second substrate and the third substrate, wherein the lens module includes a plurality of lenses therein.

19. The package structure of claim 18, wherein the sensor chip is mounted to the liquid crystal lens such that the lens module is disposed between the sensor chip and the liquid crystal lens.

20. The package structure of claim 13, further comprising:
a printed circuit board that includes a plurality of third electrical contacts and which is mounted to the sensor chip such that each of the first electrical contacts is electrically connected to one of the third electrical contacts.

21. The package structure of claim 20, wherein the printed circuit board further includes fourth electrical contacts, the structure further comprising:

a plurality of wires each extending between and electrically connecting one of the second electrical contacts and one of the fourth electrical contacts.

22. The package structure of claim 13, wherein the front surface of the sensor chip is mounted to the third substrate of the liquid crystal lens by a layer of adhesive therebetween.

23. A package structure, comprising:
   a sensor chip that includes:
      a first substrate with front and back opposing surfaces,
      a plurality of photo detectors formed at the back surface,
      a plurality of contact pads formed at the back surface which are electrically coupled to the photo detectors, and
      a plurality of first electrical contacts each extending from the back surface and through the first substrate to the front surface;
   a liquid crystal lens that includes:
      a layer of liquid crystal material,
      one or more lead patterns adjacent the layer of liquid crystal material, and
      a plurality of second electrical contacts each extending from one of the one or more lead patterns;
   wherein the sensor chip is mounted to the liquid crystal lens such that each of the second electrical contacts is electrically connected to one of the plurality of first electrical contacts and the plurality of photo detectors are disposed under the liquid crystal material for receiving light passing through the liquid crystal material and through the front surface.

24. The package structure of claim 23, wherein at least one of the first electrical contacts is in electrical contact with one of the contact pads.

25. The package structure of claim 23, wherein at least one of the first electrical contacts is formed through, and in electrical contact with, one of the contact pads.

26. The package structure of claim 23, wherein the sensor chip is mounted to the liquid crystal lens by a spacer which is disposed between the sensor chip and the liquid crystal lens, and wherein the spacer includes a plurality of third electrical contacts each extending through the spacer and each electrically connected between one of the plurality of second electrical contacts and one of the plurality of first electrical contacts.

27. The package structure of claim 26, wherein the spacer comprises a cavity disposed over the plurality of photo detectors.

28. The package structure of claim 23, wherein the liquid crystal lens further comprises:
   a second substrate adjacent the one or more lead patterns and the layer of liquid crystal material, wherein each of the second electrical contacts extends through the second substrate.

29. The package structure of claim 28, wherein the liquid crystal lens further comprises:
   a third substrate, wherein the one or more lead patterns and the layer of liquid crystal material are disposed between the second and third substrates.

30. The package structure of claim 28, wherein the liquid crystal lens further comprises:
   an optical element mounted to one of the second substrate and the third substrate.

31. The package structure of claim 28, wherein the liquid crystal lens further comprises:
   a lens module mounted to one of the second substrate and the third substrate, wherein the lens module includes a plurality of lenses therein.

32. The package structure of claim 31, wherein the sensor chip is mounted to the liquid crystal lens such that the lens module is disposed between the sensor chip and the liquid crystal lens.

33. The package structure of claim 23, further comprising:
   a handler mounted to the back surface of the sensor chip;
   a plurality of third electrical contacts that each extend through the handler and to one of the contact pads;
   wherein each of the plurality of first electrical contacts extends through the handler.

34. A package structure, comprising:
   a sensor chip that includes:
      a first substrate with front and back opposing surfaces,
      a plurality of photo detectors formed at the back surface, and
      a plurality of contact pads formed at the back surface which are electrically coupled to the photo detectors;
   a liquid crystal lens that includes:
      second and third substrates,
      a layer of liquid crystal material disposed between the second and third substrates,
      one or more lead patterns adjacent the layer of liquid crystal material and disposed between the second and third substrates, and
      a plurality of first electrical contacts each extending from one of the one or more lead patterns and through the second substrate;
   wherein the front surface of the sensor chip is mounted to the third substrate of the liquid crystal lens such that the plurality of photo detectors are disposed under the liquid crystal material for receiving light passing through the liquid crystal material and the front surface.

35. The package structure of claim 34, wherein the front surface of the sensor chip is mounted to the third substrate of the liquid crystal lens by a spacer which is disposed between and attached to the front surface of the sensor chip and the third substrate of the liquid crystal lens.

36. The package structure of claim 35, wherein the spacer comprises a cavity disposed over the plurality of photo detectors.

37. The package structure of claim 34, wherein the liquid crystal lens further comprises:
   an optical element mounted to the second substrate.

38. The package structure of claim 34, wherein the liquid crystal lens further comprises:
   a lens module mounted to one of the second substrate and the third substrate, wherein the lens module includes a plurality of lenses therein.

39. The package structure of claim 38, wherein the sensor chip is mounted to the liquid crystal lens such that the lens module is disposed between the sensor chip and the liquid crystal lens.

40. The package structure of claim 34, further comprising:
   a printed circuit board that includes a plurality of second electrical contacts and which is mounted to the sensor chip such that each of the contact pads is electrically connected to one of the second electrical contacts.

41. The package structure of claim 40, wherein the printed circuit board further includes third electrical contacts, the structure further comprising:
   a plurality of wires each extending between and electrically connecting one of the first electrical contacts and one of the third electrical contacts.

42. The package structure of claim 34, further comprising:
   a handler mounted to the back surface of the sensor chip;

a plurality of second electrical contacts that each extend through the handler and to one of the contact pads.

\* \* \* \* \*